US010561044B2

(12) United States Patent
Schmidt

(10) Patent No.: US 10,561,044 B2
(45) Date of Patent: Feb. 11, 2020

(54) FLUID MANAGEMENT FOR AUTONOMOUS VEHICLE SENSORS

(71) Applicant: Ford Global Technologies, LLC, Dearborn, MI (US)

(72) Inventor: David Schmidt, Dearborn, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 346 days.

(21) Appl. No.: 15/422,503

(22) Filed: Feb. 2, 2017

(65) Prior Publication Data

US 2018/0220555 A1     Aug. 2, 2018

(51) Int. Cl.
*H05K 7/20* (2006.01)
*G05D 1/00* (2006.01)

(52) U.S. Cl.
CPC ....... *H05K 7/20872* (2013.01); *G05D 1/0088* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 2,991,120 A | * | 7/1961 | Bela Barenyi | B60R 9/04 296/208 |
| 3,825,297 A | * | 7/1974 | Barenyi | B62D 25/06 250/557 |
| 4,589,694 A | * | 5/1986 | Kempter | B60J 7/022 29/527.1 |
| 4,892,351 A | | 1/1990 | Ono et al. | |
| 5,540,478 A | * | 7/1996 | Schuch | B60J 7/04 224/331 |
| 6,189,961 B1 | | 2/2001 | Poliskie et al. | |
| 6,623,069 B2 | * | 9/2003 | Grimm | B60Q 3/66 296/214 |
| 7,021,704 B2 | * | 4/2006 | Ortega Martinez | B62D 25/06 296/187.13 |
| 7,198,323 B2 | * | 4/2007 | Schoenauer | B60J 7/0015 296/213 |
| 7,374,234 B2 | * | 5/2008 | Deschatres | B60J 7/0084 296/208 |
| 7,581,434 B1 | * | 9/2009 | Discenzo | G01N 33/2888 73/53.01 |
| 7,815,252 B2 | | 10/2010 | Huelke | |
| 7,866,739 B2 | * | 1/2011 | Thiele | B29C 53/20 296/208 |
| 8,998,297 B1 | * | 4/2015 | Khaykin | B60J 1/007 296/187.03 |
| 9,131,630 B2 | * | 9/2015 | Brandenburg | H05K 7/20927 |

(Continued)

*Primary Examiner* — Nicholas K Wiltey
(74) *Attorney, Agent, or Firm* — Vichit Chea; Brooks Kushman, P.C.

(57) ABSTRACT

An autonomous vehicle includes an autonomous-driving system having at least one autonomous vehicle component disposed at a roof region of the autonomous vehicle. The autonomous vehicle further includes a thermal management system adapted to transmit a coolant in proximity to the autonomous vehicle component. The autonomous vehicle further includes a fluid management system having a catch basin secured to the roof region below the autonomous vehicle component. The fluid management system further includes a drain tube secured to the catch basin to receive coolant collected in the catch basin.

18 Claims, 2 Drawing Sheets

(56) References Cited

U.S. PATENT DOCUMENTS

| | | | |
|---|---|---|---|
| 9,481,241 B2 | 11/2016 | Jackson | |
| 9,600,768 B1* | 3/2017 | Ferguson | G06N 5/02 |
| 9,694,655 B2* | 7/2017 | Lafleur-Hunker | B60R 13/0815 |
| 10,046,713 B2* | 8/2018 | Maranville | B60R 9/04 |
| 10,086,680 B2* | 10/2018 | Roland | B60R 13/07 |
| 10,155,492 B2* | 12/2018 | Felix Frias | B60N 3/18 |
| 2006/0001245 A1 | 1/2006 | Romig | |
| 2006/0284450 A1* | 12/2006 | Regnier | B60J 7/024 296/216.01 |
| 2007/0085386 A1* | 4/2007 | Zirbs | B62D 25/06 296/218 |
| 2008/0061603 A1* | 3/2008 | Romig | B60J 7/0084 296/213 |
| 2008/0190288 A1* | 8/2008 | Chu | B01D 47/06 95/24 |
| 2010/0019544 A1 | 1/2010 | Thiele | |
| 2010/0140983 A1* | 6/2010 | Huelke | B60R 13/07 296/213 |
| 2012/0305044 A1* | 12/2012 | Zykin | F25B 21/04 136/201 |
| 2013/0014916 A1* | 1/2013 | Wadley | E01C 11/26 165/104.21 |
| 2013/0087307 A1* | 4/2013 | Brandenburg | H05K 7/20872 165/51 |
| 2013/0197745 A1* | 8/2013 | Skelton | G01M 17/007 701/34.4 |
| 2013/0206266 A1* | 8/2013 | Stenhouse | B60S 1/50 137/899.4 |
| 2013/0295478 A1* | 11/2013 | Han | H01M 8/04925 429/428 |
| 2014/0130533 A1* | 5/2014 | Karas | B60H 1/3233 62/291 |
| 2014/0262161 A1* | 9/2014 | Weigand | G06F 1/203 165/104.33 |
| 2014/0277894 A1* | 9/2014 | Doyle | G01C 21/3407 701/23 |
| 2015/0027158 A1* | 1/2015 | Ahmad | B60H 1/3233 62/288 |
| 2015/0114972 A1* | 4/2015 | Allen | F16N 31/004 220/573 |
| 2015/0246605 A1* | 9/2015 | Kleinhoffer | B60J 10/24 296/216.06 |
| 2015/0247511 A1* | 9/2015 | Barr | F15B 1/26 60/327 |
| 2015/0291002 A1 | 10/2015 | Smith | |
| 2015/0307026 A1* | 10/2015 | Minikey, Jr. | B60R 11/04 348/148 |
| 2015/0333379 A1* | 11/2015 | Janarthanam | B60L 58/26 429/61 |
| 2016/0138878 A1 | 5/2016 | Gopal | |
| 2016/0229272 A1* | 8/2016 | Guo | B60J 7/0084 |
| 2016/0236725 A1* | 8/2016 | Shirai | B62D 35/00 |
| 2017/0064877 A1* | 3/2017 | Ratcliffe | H05K 7/20272 |
| 2017/0158035 A1* | 6/2017 | Lafleur-Hunker | B60J 7/0084 |
| 2017/0190300 A1* | 7/2017 | Maranville | B60R 9/04 |
| 2017/0261273 A1* | 9/2017 | Maranville | F25B 1/00 |
| 2017/0305242 A1* | 10/2017 | Gallagher | B60J 7/043 |
| 2018/0001784 A1* | 1/2018 | Porras | B60L 58/26 |
| 2018/0072253 A1* | 3/2018 | Felix Frias | B60N 3/18 |
| 2018/0086224 A1* | 3/2018 | King | B60L 58/26 |
| 2018/0109061 A1* | 4/2018 | Pardhan | H01S 3/0405 |
| 2018/0134234 A1* | 5/2018 | Nickolaou | B60R 11/04 |
| 2018/0201273 A1* | 7/2018 | Xiao | B60W 40/09 |
| 2018/0220555 A1* | 8/2018 | Schmidt | G05D 1/0088 |
| 2018/0272997 A1* | 9/2018 | Swain | G01S 7/4813 |
| 2018/0292870 A1* | 10/2018 | Wischnesky | G06F 1/20 |
| 2018/0304765 A1* | 10/2018 | Newman | B60K 6/28 |
| 2018/0342640 A1* | 11/2018 | Kang | B32B 17/10018 |
| 2019/0016231 A1* | 1/2019 | Scaringe | B60L 58/21 |
| 2019/0016306 A1* | 1/2019 | Krishnan | B60S 1/0848 |
| 2019/0023149 A1* | 1/2019 | Chen | B60L 50/66 |
| 2019/0024985 A1* | 1/2019 | Wadley | E01C 11/26 |
| 2019/0033164 A1* | 1/2019 | Ing | G01M 3/3236 |
| 2019/0054794 A1* | 2/2019 | Wischnesky | B60H 1/00271 |
| 2019/0061462 A1* | 2/2019 | Smith | B60H 1/00271 |
| 2019/0061885 A1* | 2/2019 | Baro | B63B 35/44 |
| 2019/0070924 A1* | 3/2019 | Mancini | B60H 1/00278 |
| 2019/0073737 A1* | 3/2019 | Marchio | G06Q 50/30 |
| 2019/0171258 A1* | 6/2019 | Rice | B60R 16/0231 |

* cited by examiner

FLUID MANAGEMENT FOR AUTONOMOUS VEHICLE SENSORS

TECHNICAL FIELD

This disclosure relates to fluid management for autonomous vehicle sensors, and more specifically, to a fluid management system for roof-mounted autonomous vehicle sensors.

BACKGROUND

A vehicle such as an automobile may be configured for autonomous driving operations. For example, the vehicle may include a central control unit or the like (e.g., a computing device having a processor and a memory) that receives data from various vehicle data collection devices such as sensors. The central control unit may also receive data such as navigation information from external data sources. The central control unit may provide instructions to various vehicle components such as actuators and the like that control steering, braking, acceleration, etc., to control vehicle operations without action, or with reduced action, by a human operator.

SUMMARY

An autonomous vehicle includes an autonomous-driving system having at least one autonomous vehicle component disposed at a roof region of the autonomous vehicle. The autonomous vehicle further includes a thermal management system adapted to transmit a coolant in proximity to the autonomous vehicle component. The autonomous vehicle further includes a fluid management system having a catch basin secured to the roof region below the autonomous vehicle component. The fluid management system further includes a drain tube secured to the catch basin to receive coolant collected in the catch basin.

A fluid management system for an autonomous vehicle includes a catch basin adapted to be secured to a roof region of the vehicle in proximity to at least one autonomous vehicle component. The fluid management system further includes at least one drain tube secured to the catch basin adjacent a catch basin drain opening to receive coolant collected in the catch basin. The at least one drain tube extends from the roof region to a lower region of the vehicle.

A fluid control system for an autonomous vehicle includes a closed-loop liquid cooling system adapted to transmit a coolant through a catch basin disposed at a roof region of the autonomous vehicle. The fluid control system further includes at least one sensor adapted to sense a coolant property of the coolant within the closed-loop liquid cooling system. The fluid control system further includes a controller in communication with the at least one sensor and configured to communicate an indication of a fluid leakage to a user.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
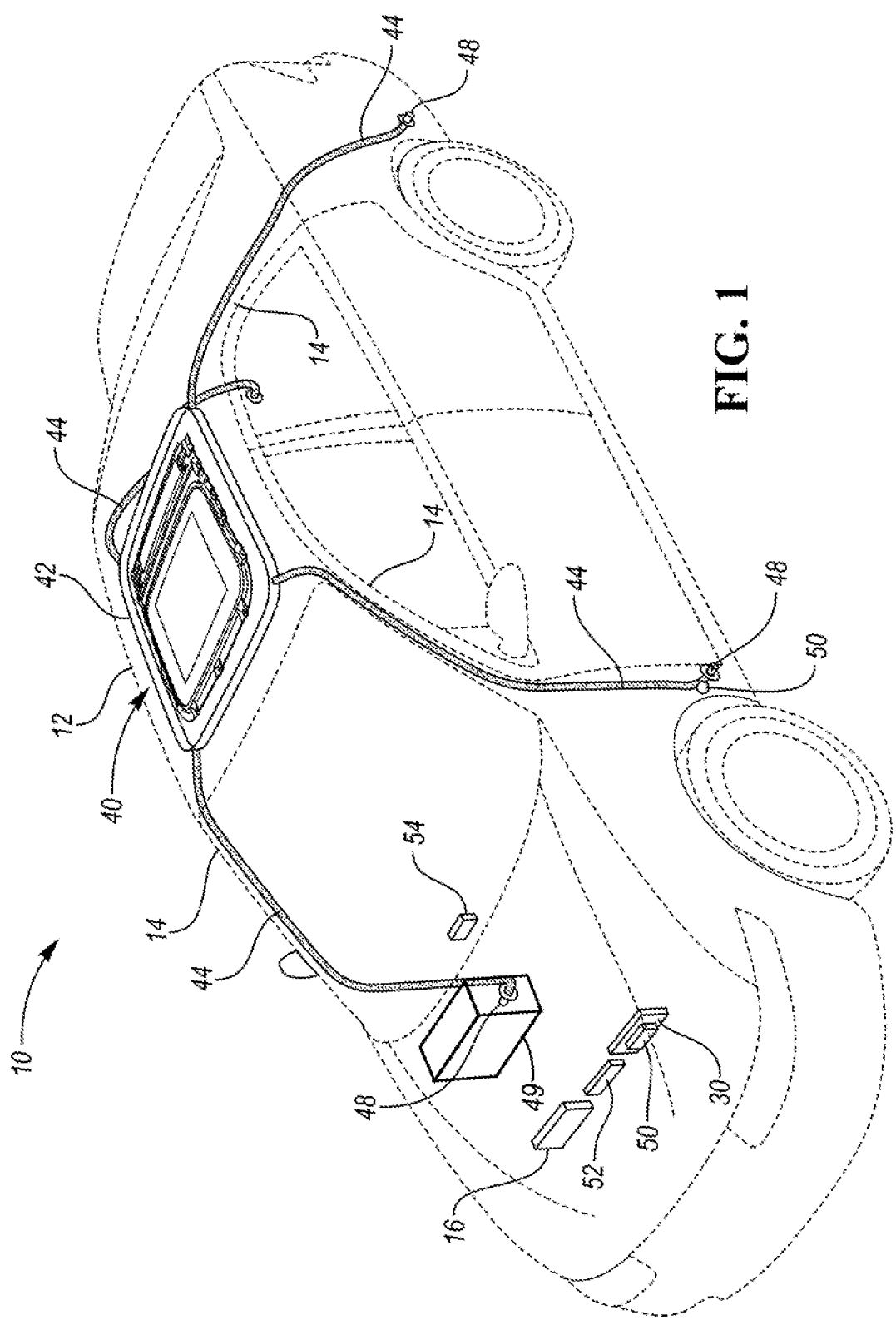
FIG. 1 is a perspective view of a vehicle having a fluid management system.

Referring now to FIG. 1, a vehicle 10 includes a roof panel 12 supported by pillars 14. The vehicle 10 may include an autonomous-driving system 16 having autonomous-driving components that provide semi-autonomous or autonomous driving features to the vehicle 10. These autonomous-driving components may connect to a vehicle network, and may send and receive information with the existing features of the vehicle. The autonomous-driving system 16 may include an electrical architecture and control system for automated driving functions. The autonomous-driving system 16 may receive input from various sensors, and may utilize driving algorithms to command braking, steering, acceleration, and other functions of the vehicle.

Figure 2:
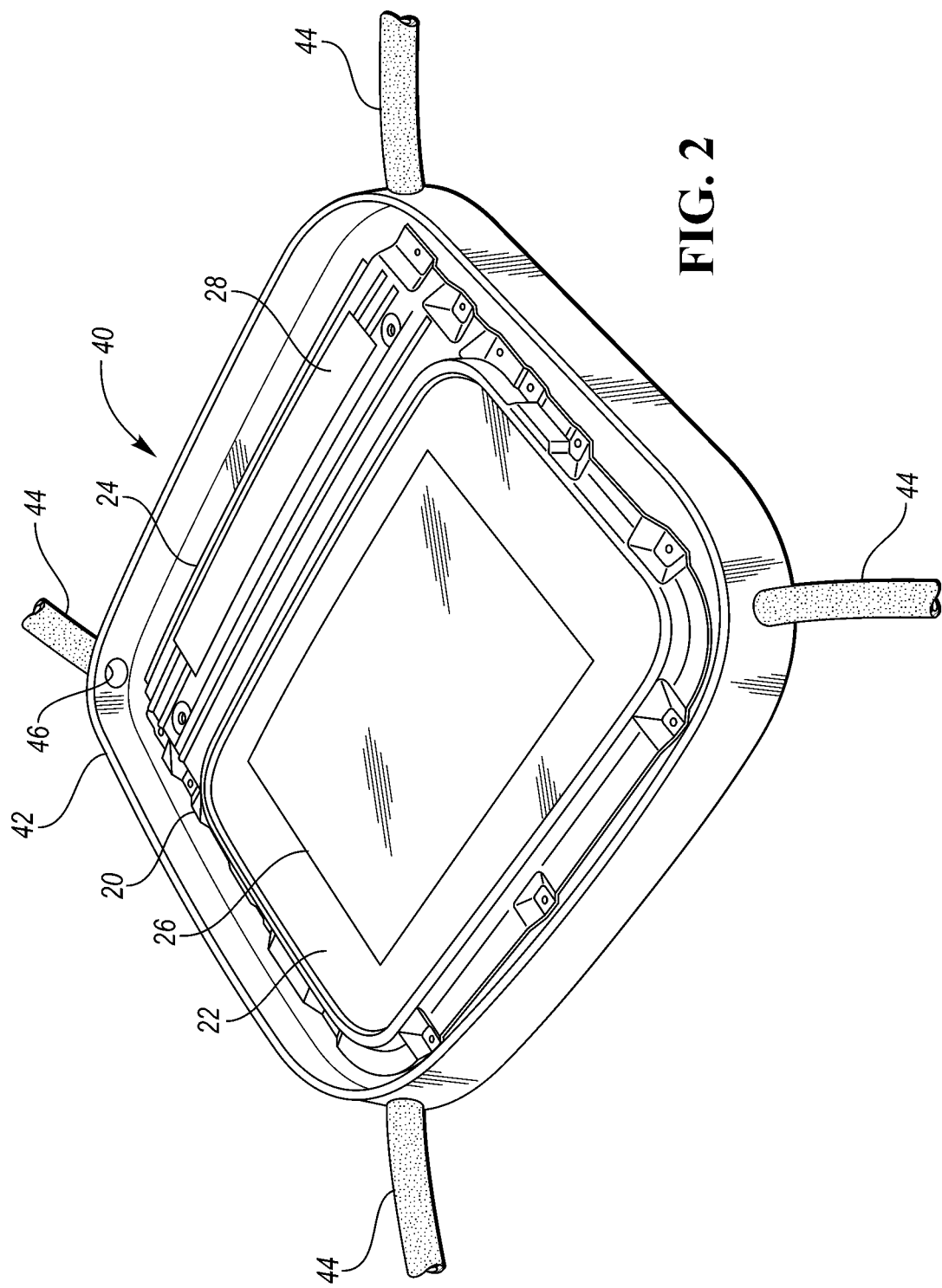
FIG. 2 is a perspective view of a roof-mounted portion of a fluid management system.

Referring to FIG. 2, the autonomous-driving system 16 may include a support structure 20 defining a cartridge 22 and a tray 24. The support structure 20 is adapted to support one or more autonomous vehicle components. For example, one or more autonomous vehicle sensors 26 may be disposed in and supported by the cartridge 22. The autonomous vehicle sensors 26 may be any sensor that may be mounted to the roof region of the vehicle 10 to provide semi-autonomous or autonomous driving features. Electrical components 28 required for the operation of the autonomous vehicle sensors 26 may be disposed in and supported on the tray 24. The electrical components 28 may include any component required for operation of the sensors 26, including but not limited to controller, cooling systems, or cabling.

The cartridge 22 may be composed of a carbon fiber composite material. Alternatively, the cartridge 22 may be a lightweight aluminum or any other lightweight panel to thereby allow the support structure 20 to support the plurality of sensors 26. The tray 24 may also be composed of a lightweight aluminum, or any other lightweight material, which provides support for the electrical components 28 on the tray 24. The areas defined by the cartridge 22 and the tray 24 may be optimized based on the relative sizes of the sensors 26 and the components 28, respectively. This allows the electrical components 28 for the sensors 26 to be disposed relatively close for optimal sensing.

In many implementations, autonomous vehicle sensors 26 and the electrical components 28 generate heat during operation. Furthermore, as the sensors 26 and the electrical components 28 are disposed at the roof 12 of the vehicle 10, the sensors 26 and electrical components 28 may further be heated by energy from the Sun. For example, on a 75° F. (24° C.) day, typical temperatures may be approximately 108° F. (42° C.).

As such, the vehicle 10 may be provided with a thermal management or cooling system 30 to assist in maintaining proper operating temperatures for components of the autonomous-driving system 16. The thermal management system 30, shown schematically in FIG. 1, may take various forms such as forced air or liquid cooling systems. The thermal management system 30 may include heat sinks or cooling plates mounted to, or in contact with, the sensors 26 and/or the electrical components 28. For example, the support structure 20 may act as a heat sink or cooling plate to receive heat from the electrical components 28. In another example, heat sinks and/or cooling plates may be mounted to, or in contact with, the support structure 20. In this way, heat generated by the sensors 26 and electrical components 28 may be transferred to the heat sinks and cooling plates.

In a preferred approach, the thermal management system 30 includes a closed-loop liquid cooling system. In this approach, a coolant is cycled (e.g., using a pump) through a fluid channel defining a coolant loop. The coolant may be, for example, a mixture of approximately 50% ethylene glycol and approximately 50% water. In some approaches, a corrosion inhibitor may be added to the mixture. Other coolants and coolant compositions are expressly contemplated.

At the roof 12 of the vehicle 10, the coolant loop runs proximate the sensors 26 and/or the electrical components 28 of the autonomous-driving system 16. In one approach, the coolant loop runs adjacent to the heat sinks or cooling plates mounted to, or in contact with, the sensors 26 and/or the electrical components 28. In another approach, the coolant loop runs adjacent to the support structure 20, to which the heat sinks or cooling plates may be mounted to or in contact with.

As the liquid coolant passes the heat sinks or cooling plates associated with the sensors 26 or electrical components 28, heat is transferred from the heat sinks or cooling plates to the coolant. In some applications, the coolant used to cool the sensors 26 and electrical components 28 may reach approximately 158° F. (70° C.). Upon transfer of heat to from the sensors 26 and electrical components 28, the coolant travels through the coolant loop to a heat exchanger, where heat is rejected to the ambient air.

To manage coolant flowing through the thermal management system 30, the autonomous vehicle 10 may be provided with a fluid management system 40. The fluid management system 40 includes a catch basin 42 installed at the roof 12 of the vehicle. The catch basin 42 may be disposed, for example, between a headliner of the vehicle 10 and an external roof structure of the vehicle 10.

In a preferred approach, the catch basin 42 is secured to the roof region 12 below one or more components of the autonomous-driving system 16. In this approach, the support structure 20 of the autonomous-driving system 16 may be disposed within the catch basin 42. For example, the sensors 26 or electrical components 28 of the support structure 20 may be received within a cavity of the catch basin 42. The catch basin 42 may have a continuous bottom on which the support structure 20 is installed or otherwise retained.

In another approach, the catch basin 42 defines a ring adapted to surround the sensors 26 and/or the electrical components 28. For example, the catch basin 42 may form a ring about the periphery of the support structure 20.

In either approach, the catch basin 42 is adapted to collect coolant or other fluid that may leak from the sensors 26 or electrical components 28 of the support structure 20. The catch basin 42 may be, for example, a shallow tray adapted to cover or attach to the underside of the areas serviced by the thermal management system 30. In the approach shown, the catch basin 42 is a generally square catch basin having upright walls surrounding the support structure 20 of the autonomous-driving system 16. The catch basin 42 may take any form suitable to captures leakage from the thermal management system 30, thereby reducing the likelihood of the heated coolant from entering the cabin of the vehicle. The catch basin 42 may be formed, for example, of a metal or plastic material suitable for retaining coolant, including heated coolant (e.g., coolant heated to approximately 158° F. (70° C.)).

The fluid management system 40 may further include one or more drain tubes 44 extending from the catch basin 42. The drain tubes 44 may be any flexible tube for allowing a fluid to flow there through. In a preferred approach, the drain tubes 44 are formed of aluminum, a synthetic rubber, or any other material suitable for transferring heated liquid coolant.

Each drain tube 44 may be secured to the catch basin 42 at drain openings 46 (shown in FIG. 2) disposed through a wall of the catch basin 42. The catch basin drain openings 46 may take any suitable shape and extend through the entire thickness of the catch basin 42 to permit fluid communication from inside the catch basin 42 to outside the catch basin 42. Furthermore, the drain openings 46 are preferably located at lower regions of the catch basin 42 so as to receive fluid collected in the catch basin 42. In a preferred approach, the catch basin 42 includes at least four drain openings 46 disposed at the corners of the catch basin 42. However, the catch basin 42 may be provided with one, two, three, or five or more drain openings 46. Furthermore, the drain openings 46 may be disposed at any suitable location of the catch basin 42.

The drain tubes 44 are configured to route a fluid collected in the catch basin 42 to a lower region of the vehicle 10. In the illustrated example of FIG. 1, the drain tubes 44 are disposed within the pillars 14 of the vehicle 10. For example, the drain tubes 44 may travel through the forward and rear pillars in the space empty space between the inner and outer body structure. From the pillars 14, the drain tubes 44 may travel down into the lower region of the body structure of the vehicle 10. As used herein, the lower region of the body structure of the vehicle refers to a region of the vehicle 10 below the lower ends of the pillars 14. For example, the lower region may be a region at or below the underbody of the vehicle 10. In this way, fluid traveling from the catch basin 42 through the drain tubes 44 may exit out underneath the vehicle 10.

Each drain tube 44 may be provided with a drainage outlet 48. In one approach, the drainage outlet permits fluid flow to the exterior of the vehicle 10. To regulate discharge, the drainage outlet may be provided with drainage valves. In this way, an end user or service technician may drain each drain tube 44 in a controlled process to dispose of leaked coolant.

In another approach, at least one drain tube 44 is connected to an individual retention basin 49 disposed in the lower region of the vehicle 10 and having an associated tube valve. In still another approach, each drain tube may be connected to a single collective retention basin. In still another approach, a forward set of drain tubes may be connected to a forward retention basin, and a rear set of drain tubes may be connected to a rear retention basin. Retention basins may be, for example, plastic tanks. In a preferred approach, a retention basin includes an overflow opening at the top such that, in the event of a tank overflow, retained fluid may drain out onto the ground rather than backing up into the drain tubes, and potentially backing up into the catch basin. In these approaches, the fluid routed by the drain tubes may be retained in one or more retention basins until the fluid may be safely disposed of. For example, the one or more retention basins may be provided with a drain plug disposed at the bottom (or other suitable location) of each basin. An end user or service technician may then drain the one or more retention basins in a controlled process to dispose of leaked coolant.

In a preferred approach, the fluid management system 40 may include one or more sensors 50. For example, as shown schematically in FIG. 1, one or more sensors 50 may be disposed within the thermal management system 30 (e.g., within the closed loop liquid cooling system). The sensors 50 may be any sensor capable of sensing a coolant property within closed loop liquid cooling system. In one approach, the sensors 50 are disposed within fluid conduit of the thermal management system 30 to detect one or more properties of fluid flow through the thermal management system 30. For example, the sensors 50 may be configured to detect a pressure drop in the coolant. The sensors 50 may further be configured to detect a temperature increase or sustained elevated temperature of the sensors 26 or electrical components 28 connected to the support structure 20. Detected coolant pressure drops or temperature increases may be indicative of one or more leaks in the thermal management system 30.

In another approach, one or more sensors may be located in the catch basin 42. In still another approach, one or more sensors may be located within one or more of the retention basins. Sensors within the catch basin 42 or the retention basins may be adapted to detect the presence of fluid, thereby indicating a fluid leak in the thermal management system 30. Such sensors may be pressure sensors, corrosion test structures, humidity sensors, or other sensors capable of sensing a leak in the thermal management system 30.

The autonomous vehicle 10 may be provided with a fluid control system. For example, a controller 52, shown schematically in FIG. 1, may be in communication with the sensors 50. The controller 52 may be adapted to continuously monitor the sensors 50 for indication of a leakage in the thermal management system 30.

In response to the sensors 50 detecting a leakage in the thermal management system 30, the controller 52 may be configured to discontinue service of the autonomous vehicle 10 until further user action is taken. For example, the controller 52 may be configured command the autonomous vehicle 10 to autonomously park in a safe manner and to shut down so as to prevent damage to the sensors 26 or electrical components 28.

The autonomous vehicle 10 may further be provided with a user interface 54 disposed, for example, in a cabin of the autonomous vehicle 10. The controller 52 may be configured to command the user interface 54 may provide a user an indication of a fluid leak detected in the thermal management system 30. The user interface 54 may include a visual or audio indicator. For example, the user interface 54 may be a graphical display. The user interface 54 may instead, or also, be an audible alarm. The controller 52 may be adapted to communicate the indication of the fluid leakage in response to one or more sensors 50 detecting a change in coolant pressure within the closed-loop liquid cooling system.

In this way, an autonomous vehicle with a thermal management system may be provided with a fluid management system for collecting leaked fluid, such as heated coolant fluid, from the roof of the vehicle and safely diverts the leaked fluid. The fluid management system described herein may reduce the risk of leaked fluid dripping into the passenger cabin of the vehicle.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An autonomous vehicle comprising:
   an autonomous-driving system having at least one autonomous vehicle component disposed at a roof panel of the autonomous vehicle;
   a thermal management system adapted to transmit a coolant in thermal communication with the autonomous vehicle component; and
   a fluid management system having
      a catch basin secured to the roof panel below the autonomous vehicle component and defining a cavity adapted to receive the at least one autonomous vehicle component and a continuous bottom on which the autonomous vehicle component is installed, and
      a drain tube secured to the catch basin to receive coolant collected in the catch basin.

2. The autonomous vehicle of claim 1, wherein the at least one autonomous vehicle component of the autonomous-driving system is an autonomous vehicle sensor.

3. The autonomous vehicle of claim 1, wherein the at least one autonomous vehicle component of the autonomous-driving system is an electrical component associated with an autonomous vehicle sensor.

4. The autonomous vehicle of claim 1, wherein the thermal management system includes at least one of a heat sink and a cooling plate disposed in contact with the autonomous vehicle component.

5. The autonomous vehicle of claim 4, wherein the thermal management system includes at least one closed-loop liquid cooling system disposed in contact with the at least one heat sink and cooling plate.

6. The autonomous vehicle of claim 1, wherein the drain tube is secured to the catch basin adjacent a catch basin drain opening, and wherein the drain tube extends downward from the roof panel to drain coolant from the catch basin.

7. The autonomous vehicle of claim 1, further comprising:
   at least one sensor adapted to sense a coolant property within the thermal management system; and
   a controller in communication with the at least one sensor and configured to communicate an indication of a fluid leakage to a user at a user interface.

8. A fluid management system for an autonomous vehicle, comprising:
- a catch basin adapted to be secured to a roof panel of the vehicle beneath a liquid cooling system in thermal communication with at least one autonomous vehicle component and defining a cavity adapted to receive the at least one autonomous vehicle component and a continuous bottom on which the autonomous vehicle component is installed; and
- at least one drain tube secured to the catch basin adjacent a catch basin drain opening to receive coolant collected in the catch basin, the at least one drain tube extending downward from the roof panel to drain coolant from the catch basin.

9. The fluid management system of claim 7, wherein the at least one drain tube extends downward through a pillar of the vehicle from the roof panel of the vehicle, and wherein the at least one drain tube is adapted to direct coolant from the catch basin through the pillar of the vehicle.

10. The fluid management system of claim 7, wherein the at least one drain tube includes a drainage outlet to permit fluid flow to an exterior of the vehicle.

11. The fluid management system of claim 7, wherein the at least one drain tube is connected to a retention basin disposed beneath the catch basin.

12. The fluid management system of claim 7, wherein the at least one drain tube is a plurality of drain tubes, and wherein the plurality of drain tubes is connected to a retention basin disposed beneath the catch basin.

13. A fluid control system for an autonomous vehicle, comprising:
- a closed-loop liquid cooling system adapted to circulate a coolant therethrough and disposed at a roof panel of the autonomous vehicle;
- a catch basin mounted beneath the closed-loop liquid cooling system and defining a cavity adapted to receive the closed-loop cooling system and a continuous bottom on which the closed-loop cooling system is installed to collect coolant expelled from the closed-loop liquid cooling system;
- at least one sensor adapted to sense a coolant property of the coolant within the closed-loop liquid cooling system; and
- a controller in communication with the at least one sensor and configured to communicate an indication of a fluid leakage to a user.

14. The fluid control system of claim 13, wherein the at least one sensor is disposed within a fluid conduit of the closed-loop liquid cooling system.

15. The fluid control system of claim 13, wherein the at least one sensor is disposed within the catch basin.

16. The fluid control system of claim 13, wherein the coolant property is a coolant pressure, and wherein the controller is adapted to communicate the indication of the fluid leakage in response to the sensor detecting a change in the coolant pressure within the closed-loop liquid cooling system.

17. The fluid control system of claim 13, wherein the controller is adapted to communicate the indication of the fluid leakage to the user at a user interface disposed within a cabin of the autonomous vehicle.

18. The fluid control system of claim 13, further comprising at least one drain tube secured to the catch basin adjacent a catch basin drain opening to transmit coolant collected in the catch basin, the at least one drain tube extending downward from the roof panel to drain coolant from the catch basin.

* * * * *